United States Patent
Blair (10) Patent No.: US 11,506,546 B2
(45) Date of Patent: Nov. 22, 2022

(54) SYSTEMS AND METHODS FOR MEASURING INTERNAL TRANSFORMER TEMPERATURES

(71) Applicant: Schweitzer Engineering Laboratories, Inc., Pullman, WA (US)

(72) Inventor: Jeremy William Blair, Jackson, MS (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 451 days.

(21) Appl. No.: 16/736,349

(22) Filed: Jan. 7, 2020

(65) Prior Publication Data

US 2021/0108971 A1 Apr. 15, 2021

Related U.S. Application Data

(60) Provisional application No. 62/913,985, filed on Oct. 11, 2019.

(51) Int. Cl.
*G01K 13/00* (2021.01)
*G01R 31/12* (2020.01)
(Continued)

(52) U.S. Cl.
CPC .............. *G01K 13/00* (2013.01); *G01K 1/02* (2013.01); *G01R 15/18* (2013.01);
(Continued)

(58) Field of Classification Search
CPC .. H04B 5/0037; H04B 5/0031; H04B 5/0093; H04B 5/00; H04B 5/0043; H04B 5/0087; H04B 7/15507; G01R 19/2513; G01R 31/58; G01R 31/62; G01R 31/52; G01R 1/00; G01R 19/00; G01R 31/00; G01R 22/10; G01R 35/005; G01R 22/063; G01R 15/14; G01R 15/186; G01R 21/00; G01R 21/001; G01R 21/06; G01R 31/085; G01R 15/18; G01R 31/66; H04W 40/248; H04W 84/12; H04W 88/08; G01K 1/024;
(Continued)

(56) References Cited

U.S. PATENT DOCUMENTS 4,746,241 A * 5/1988 Burbank, III .......... G01K 1/143
    374/E1.019
4,799,005 A * 1/1989 Fernandes ............... G01K 1/024
    374/E1.004

(Continued)

OTHER PUBLICATIONS

SEL-2414 Transformer Monitor, SEL-2414 Data Sheet, Schweitzer Engineering Laboratories, Inc. Mar. 2018.

*Primary Examiner* — Vinh P Nguyen
(74) *Attorney, Agent, or Firm* — Fletcher Yoder, P.C.

(57) ABSTRACT

A system may include a transformer that may convert a first voltage to a second voltage, such that the second voltage is output via a conductor. The system may also include a wireless current sensor that may detect current data associated with current conducting via the conductor and a processor. The processor may receive the current data, determine one or more temperature measurements associated with the transformer based on the current data, and send a signal to a component in response to the one or more temperature measurements exceeding one or more respective threshold values.

20 Claims, 4 Drawing Sheets

(51) Int. Cl.
  *G01R 15/18* (2006.01)
  *H02J 13/00* (2006.01)
  *H02J 50/00* (2016.01)
  *G01K 1/02* (2021.01)

(52) U.S. Cl.
  CPC .... *G01R 31/1263* (2013.01); *H02J 13/00002* (2020.01); *H02J 50/001* (2020.01); *G01K 2217/00* (2013.01)

(58) Field of Classification Search
  CPC .... G01K 7/427; G01K 3/005; G01K 2217/00; G01K 7/22; H04L 2012/2841; H04L 2012/2843; H04L 67/025; G06F 1/189; G06F 2119/06; G08C 17/02; G08C 19/00; G08C 19/02
  See application file for complete search history.

(56) References Cited

U.S. PATENT DOCUMENTS

| | | | |
|---|---|---|---|
| 6,424,266 B1 | 7/2002 | Weekes | |
| 6,906,630 B2* | 6/2005 | Georges | G05B 23/0245 340/657 |
| 8,160,824 B2* | 4/2012 | Spanier | G01R 19/00 340/657 |
| 8,665,102 B2* | 3/2014 | Salewske | G01R 19/2513 340/657 |
| 10,281,338 B2* | 5/2019 | Feng | H02H 7/04 |
| 11,114,858 B2* | 9/2021 | Hao | G01R 15/146 |
| 2015/0311714 A1* | 10/2015 | Dolezilek | H02J 13/0013 700/286 |
| 2016/0252401 A1 | 9/2016 | Feng | |

* cited by examiner

SYSTEMS AND METHODS FOR MEASURING INTERNAL TRANSFORMER TEMPERATURES

CROSS REFERENCE TO RELATED APPLICATIONS

This application claims priority from and benefit of U.S. Provisional Application Ser. No. 62/913,985, filed Oct. 11, 2019, entitled "SYSTEMS AND METHODS FOR MEASURING INTERNAL TRANSFORMER TEMPERATURES," which is hereby incorporated by reference in its entirety for all purposes.

BACKGROUND

This disclosure relates to systems and methods for monitoring properties of a transformer. More particularly, this disclosure relates to monitoring internal characteristics of transformers in a non-invasive way.

Electrical power distribution infrastructure is the backbone of powering many buildings in society. From homes to local businesses to industrial complexes, electrical power is distributed across a wide array of consumers. To transport electrical power efficiently and safely, voltage transformers are often used to step up or down the voltage at which electricity flows across a conductor. To ensure that the voltage transformers are operating correctly, internal properties of the transformers may be monitored. However, it may be difficult to monitor certain internal properties of the voltage transformers after they have been commissioned for service.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, a system may include a transformer that converts a first voltage to a second voltage, whereby the second voltage is output via a conductor, and a wireless current sensor that detects current data associated with current conducting via the conductor. The system also includes a processor, which may receive current data from the wireless current sensor and determine one or more temperature measurements associated with the transformer based on the current data. Further, the processor may send a signal to a component in response to one or more temperature measurements exceeding one or more threshold values.

In a second embodiment, a method may include receiving, via a processor, a plurality of data packets from a wireless current sensor. The plurality of data packets may include one or more current measurements associated with a conductor attached to the transformer. The method, via the processor, may further involve applying the one or more current measurements to a thermal model that is representative of a relationship between one or more temperature measurements of the transformer and one or more currents being conducted by the conductor. The processor may determine the one or more temperature measurements of the transformer based on the thermal model and the one or more current measurements. The method may also involve sending, via the processor, an alarm to a component in response to the one or more temperature measurements being above a threshold.

In a third embodiment, a non-transitory, tangible, and computer-readable medium stores instructions that when executed by a processor, cause the processor to receive a plurality of data packets from a wireless current sensor. The plurality of data packets may include one or more current measurements associated with a conductor attached to a transformer. Further, the processor may apply the one or more current measurements to a thermal model representative of a relationship between one or more temperature measurements of the transformer and one or more currents being conducted by the conductor. The instructions, when executed by the processor, may also cause one or more temperature measurements of the transformer to be determined based on the thermal model and the one or more current measurements, and may send an alarm to a component in response to the one or more temperature measurements being above a threshold.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Transformers (e.g., power transformers) may include several current transformers disposed in various positions inside a respective transformer or installed on respective bushings of the respective transformer. The current transformers may be used for different functions such as protecting, metering, and monitoring certain properties regarding the transformer. Keeping this in mind, certain transformers may not include current transformers installed therein. As such, to install a current transformer on an operating transformer, the transformer may be placed offline and may involve electrical power being removed from a power distribution line. The lack of power on the power distribution line may disrupt the activities of individuals who use the electricity provided via the power distribution line. Thus, improved systems and methods for incorporating current transformers into transformers in a non-invasive way (e.g., without removing power) are desirable.

In one embodiment, a wireless current sensor (WCS) may be incorporated into an electrical delivery system to monitor certain internal properties of the transformer. The WCS may be located near a transformer and may wirelessly send various types of data, such as a current magnitude, phase, and angle, to a transformer controller. The transformer controller may be located on or near a transformer and may contain processing circuitry (e.g., a computer processor) that may receive data from a WCS and control operations of the transformer based on the data and certain ratings (e.g., current rating, voltage rating, temperature rating) associated with the transformer.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular abstract data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

Figure 1:
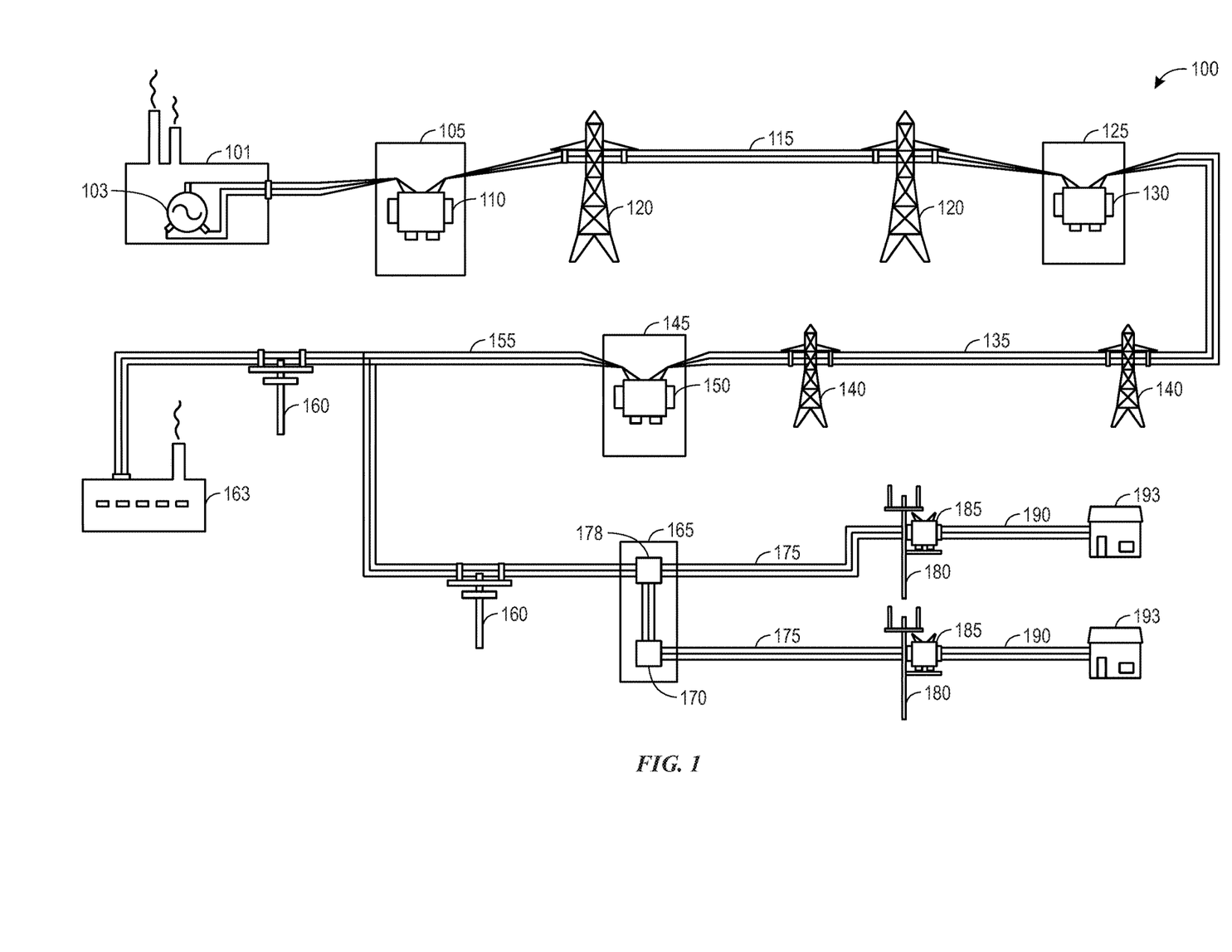
FIG. 1 illustrates a typical electric power system, including power generation, transmission, and distribution, in accordance with an embodiment.

Turning now to the figures, FIG. 1 illustrates a simplified diagram of an embodiment of an electric power delivery system 100. For example, the electric power delivery system 100 may generate, transmit, and/or distribute electric energy to loads. Typically it consists of: generating stations that produce electric power; electrical substations for stepping electrical voltage up for transmission, or down for distribution; high voltage transmission lines that carry power from distant sources to demand-centers; and distribution lines that connect individual customers. Power stations may be located away from heavily-populated areas, for instance near a fuel source or at a river/reservoir dam. The electric power generated is stepped up to a higher voltage at which it connects to an electric power transmission network. The transmission network moves the electrical power long distances until it reaches regional electric power distribution network. On arrival at a substation, the electrical power is stepped down from a transmission-level voltage to a distribution-level voltage. As it exits the substation, it enters the local distribution network. Finally, upon arrival at the service location, the electrical power is stepped down again from the distribution voltage to a service voltage.

As illustrated, the electric power delivery system 100 includes electric power generating station 101 where an electric generator 103 is installed. The electric power delivery system 100 may also include transmission station 105 where a step-up transformer 110 is installed. The electric power delivery system 100 may also include primary transmission lines 115, towers 120, and a receiving station 125, which may include a step-down transformer 130. Following the step-down transformer 130, secondary transmission lines 135 and towers 140 may deliver power to a primary distribution station 145 that may include a transformer 150, which may function to step down the voltage between secondary transmission lines 135 and primary distribution lines 155. In the same manner as described above, the transformer 150 may supply power to primary distribution lines 155 that may be physically lifted from the ground using poles 160. Power may then be provided to industrial consumers 163 and a secondary distribution station 165, which may include circuit breakers 170 to control the flow of power in the system. Finally, secondary distribution lines 175 coupled to poles 180 may distribute power to pole-mounted distribution transformers 185, such that final distribution lines 190 may provide power to residential consumers 193. Although not shown, it should be noted that a variety of other types of equipment may also be included in electric power delivery system 100, such as voltage regulators, capacitors, capacitor banks, and suitable other types of equipment useful in power generation, transmission, and/or distribution.

The electricity that power plants (e.g., electrical power generating station 101) generate is delivered to customers over transmission and distribution systems. It is well established that high-voltage, low-current transmission results in lower power line losses. Therefore, higher voltage electricity is more efficient and less expensive for long-distance electricity transmission, while lower voltage electricity is safer for use in homes and businesses.

As can be seen from above, the electric power delivery system 100 may consist of a primary transmission system and a secondary transmission system. The primary transmission system (e.g., including transmission station 105, primary transmission lines 115 and towers 120) may provide electricity at a high voltage (normally above 100 kV) over long distance from electrical power generating station 101 to regional secondary transmission system(s). The step-up transformer 110 in transmission station 105 may increase voltages (e.g., around 20 kV) to transmission voltages (e.g., above 100 kV such as 230 kV, 500 kV, or even higher). The secondary transmission system (e.g., including receiving station 125, secondary transmission lines 135 and towers 140) may provide electricity at medium voltages from transmission system to distribution systems. At receiving station 125, the step-down transformer 130 may decrease transmission voltages to lower levels (e.g., 34.5 kV, 46 kV, and 69 kV). At this stage, large industrial customers (not illustrated here) may connect directly to this sub-transmission system.

A power distribution system may provide electricity from transmission systems to local customers. It may consist of the primary distribution system and the secondary distribution system, as described above. In one embodiment, the primary distribution system may include primary distribution station 145, primary distribution lines 155, and poles 160. On arrival at the primary distribution station 145, power is stepped down from a transmission level-voltage to a distribution-level voltage (e.g., 11 kV or 13 kV) by the transformer 150. As the primary distribution station 145 outputs the electricity, the electricity then conducts through the distribution wiring. At this stage, a medium industrial customer (e.g., such as industrial consumers 163) may connect directly to the distribution wiring. The secondary distribution system may include the secondary distribution station 165, circuit breakers 170, secondary distribution lines 175, and poles 180. In addition, the secondary distribution system may also include pole-mounted distribution transformers 185 and final distribution lines 190. At the secondary distribution station 165, circuit breakers 170 may control the flow of electricity among distribution lines. Finally, upon arrival at the service location, the voltage is stepped down further from the distribution voltage to the service voltages (e.g., 120 V, 240 V, and 480 V) using the pole-mounted distribution transformer 185.

As discussed in preceding sections, transformers adjust the electric voltage to a suitable level on each segment of the electrical power delivery system 100 from the generator to the end user. Transformers step up voltage at generation for efficient, long-haul transmission of electricity and step the voltage down for distribution to the level used by customers. Transformers are also used to step the voltage either up or down at various points where there is a change in voltage in the electrical power delivery system 100. As such, the transformers assist the electrical power delivery system 100 to efficiently and effectively provide power to various consumers.

The size of a transformer may be determined by a primary (input) voltage, a secondary (output) voltage, and a load capacity measured in volt-ampere (VA). In addition to the load capacity rating, voltage ratings are often used to describe different classes of transformers. For example, large transformers (LPTs) with voltage ratings of 115 kV and above are considered high voltage (HV), and LPTs with voltage ratings of 345 kV and above are considered extra high voltage (EHV). Transformers can carry a substantial amount of electricity. Therefore, a faulty or damaged transformer can affect the transmission/distribution capacity of a regional electric power grid, possibly leading to extended power outages. By monitoring the transformer operating status using transformer controller, which may consist of various sensors, meters, current transformers, load tap changers, and intelligent electronic devices, regional power system operators may predict when a single LPT in a substation may go offline and may perform some corrective actions to compensate for the expected loss of power.

Figure 2:
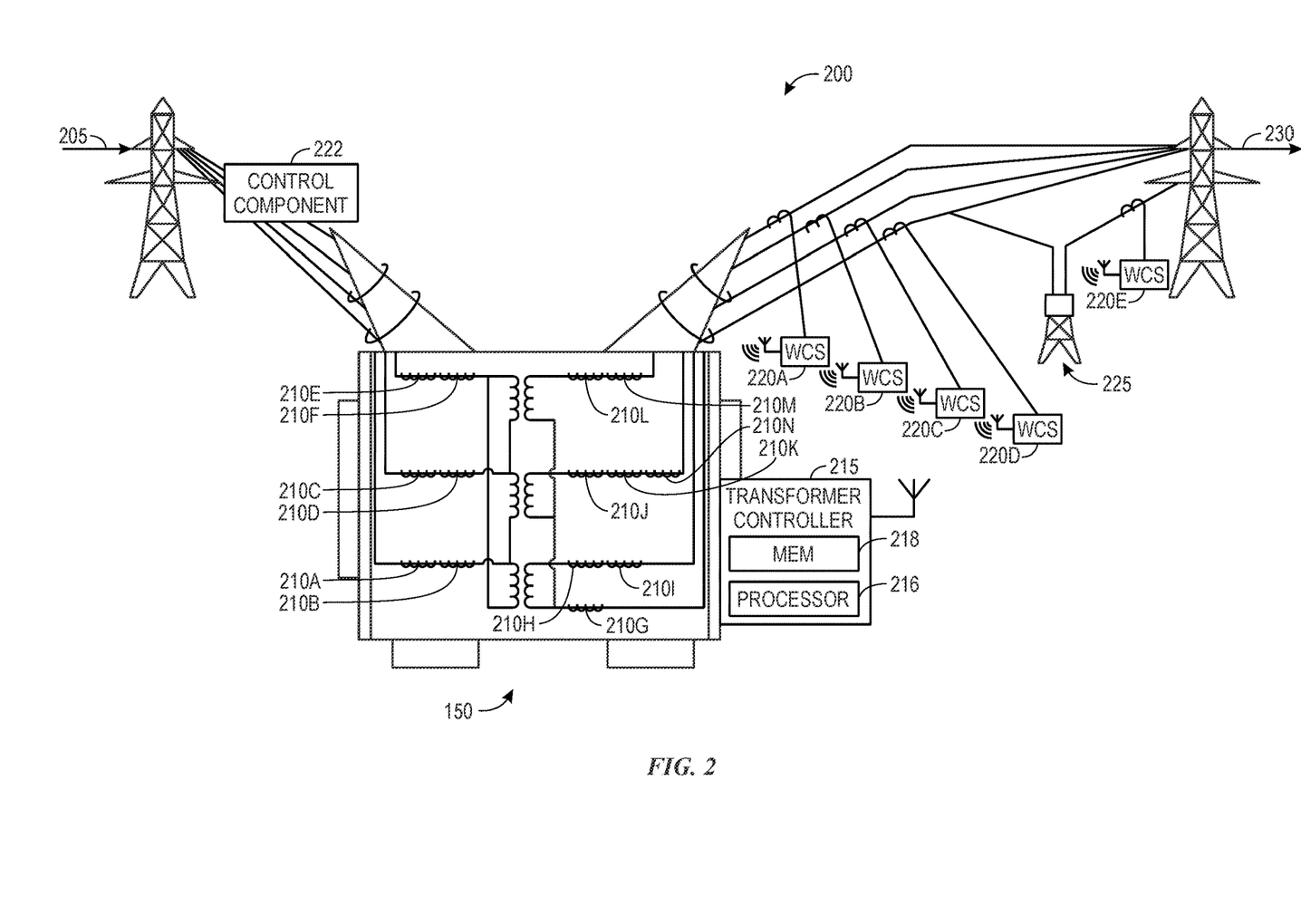
FIG. 2 illustrates a transformer with current transformers (CTs) dispersed therein and wireless current sensors (WCSs) dispersed on conductors coupled to the transformer, in accordance with an embodiment.

In some embodiments, certain circuit components may acquire data related to the operation of the transformer and may transmit the acquired data to the transformer controller. FIG. 2 is an example schematic diagram 200 with a transformer 150 that has built-in current transformers and wireless current sensors (WCSs) 220 dispersed on conductors outside of the transformer 150. A three-phase power generator from transmission grid 205 generates current which will travel to a transformer 150 by means of conducting wires. Transformer 150 is typically used to step up or step down voltage. In some embodiments, the transformer may contain current sensors (e.g., current transformers (CTs) 210) dispersed within them. These current transformers 210 may monitor different aspects of a transformer and may contain circuitry to transmit data to update a transformer controller 215 about the status of the transformer 150. The transformer controller 215 may include a computer processor 216 to receive the data, process the data using computer readable instructions stored in memory 218, and control operations of the transformer 150. For instance, CTs 210A, 210C, 210E, 210I, 210K, and 210M may be used for the protection of transformer 150. These CTs may function as part of a transformer differential relay system and may be sensitive to the occurrence of faults in the region that they are located. These CTs may monitor the occurrence of faults within the regions they occupy. Typical faults that may be detected by these CTs can be internal faults such as an earth fault, a breakdown of insulation in the core of the transformer 150, an inter-turn fault, and the like.

Another method of protecting the transformer 150 may include an overcurrent relay system. For example, the CTs 210B, 210D, 210F, and 210G may support the functioning of an overcurrent relays. Overcurrent relays protect the transformer 150 against faults and short circuits where the current conducting through a respective part of the transformer 150 exceeds some threshold current. That is, the overcurrent relays may receive a current and open a circuit to stop the flow of current when the current exceeds a threshold associated with the respective overcurrent relay. With this in mind, the CTs that support the overcurrent relay system may detect if the received current exceeds the current rating of the transformer 150 and open a contact in response to the current exceeding the ampere rating, thereby protecting the transformer 150 from thermal or electrical damage.

Further, CT 210G may be connected to a neutral wire or to a grounded wire to provide a fault backup protection mechanism. If the CT 210G senses current above a certain threshold, the CT 210G may send an indication or notification to the transformer controller 215 that a fault is detected. The CT 210 may also be a part of a relay system such that, a switch connecting of one or more wires to the transformer 150 may be opened in response to the current being above the threshold. The CTs 210H, 210J, and 210L may provide a metering for the current flow through each respective conductor. This metering of current flow may be used to calculate an amount of power that a consumer uses, and the calculated amount of power can be used to calculate a power or energy bill for the consumer. The CTs 210H, 210J, and 210L may accurately measure the current flow, since their measurements are used for billing purposes. Further, the CT 210N may be used an asset-management or a system control CT.

In some embodiments, the CTs disposed on conductors within a transformer may be used in conjunction with a controller to monitor the temperature of internal parts of the transformer. That is, the controller may receive the current measurements from the CTs and employ a thermal model to determine the temperature inside various parts of the transformer by applying the current measurements to the thermal model. With this in mind, a CT, such as CT 210N, that is intended for use with a controller may not be present on some transformers that are already installed in a substation. Indeed, in these cases, installing such a CT on a transformer that is already in operation in a substation may be challenging and disruptive since the transformers should be powered down, such that the CT can be installed in the transformer or on the bushings of the transformer. That is, to install a new CT in the transformer or on the bushings of the transformer, in one embodiment, the following procedure may be undertaken. First, electrical power provided to the transformer may be isolated. Next, an enclosure of the transformer may be opened, the new CT may be installed on an available conductor, and the enclosure of the transformer may be closed after the new CT is installed. Finally, the electrical power may be recoupled to the transformer. This process may cause consumers to lose electric power for a certain amount of time. With this in mind, the present embodiments described herein may include installing a wireless current sensor on a conductor outside of the transformer 150, such that the wireless current sensor may perform current measurements outside of the transformer 150. These measurements may be analyzed to give accurate information about certain operating conditions and measurements inside the transformer 150.

With this in mind and referring to FIG. 2, in some embodiments, wireless current sensors (WCSs) may be connected to conductors coupled to the transformer 150. In FIG. 2, WCSs 220A, 220B, 220C, 220D, and 220E may be current sensors that detect current conducting via a conductor that may be coupled to a respective current sensor. The WCS 220 may include any suitable current sensor, such as a current transformer, that wirelessly transmits information to another communication-enabled component. In one embodiment, the WCS 220 may send current data to the transformer controller 215 that may detail a magnitude, phase, and angle of the current flowing through a respective conductor. As displayed in FIG. 2, a three-phase four wire scheme is implemented on the power grid. In a three-phase power system, the current in any one of the three conductors, which, in some embodiments, are coupled between the transmission grid 205 and a left bushing of the transformer 150, are expected to be phase-shifted by an angle of 120 degrees relative to the current conducting in each of the other two conductors, while the fourth conductor may be a neutral or ground conductor. The WCS 220 attached or clamped to each of the four conductors may measure a phase, magnitude, and angle of the current flowing through them and send its respectively acquired measurements to the transformer controller 215.

Figure 3:
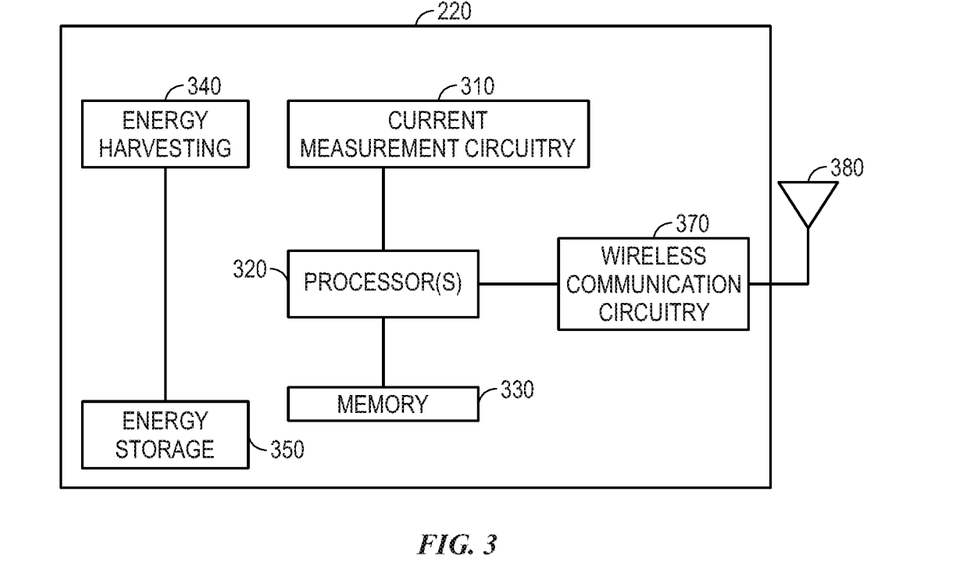
FIG. 3 is a schematic diagram of a wireless current sensor (WCS), in accordance with an embodiment.

Current data can be very useful for monitoring certain conditions of the transformer 150. By way of example, FIG. 3 is a schematic diagram of circuitry that may be part of the WCS 220. The WCS 220 may include an energy harvesting mechanism 340 to collect power through inductance or some other suitable energy harvesting tool. In one embodiment, an alternating current produces a time-varying magnetic field along with a time-varying electric field. The WCS 220 may include a core that may open and be positioned around a conductor, such that the current traversing the conductor may produce an alternating magnetic field in the core. By way of inductance, the WCS 220 may extract energy from the alternating magnetic field and/or electrical field produced in the core. The WCS 220 may have a winding around the core, such that the current traversing the conductor may induce a current in the winding around the core at some ratio depending upon the amount of turns in the winding. In some embodiments, the energy acquired via the conductor may be used to provide power to the circuit components of the WCS 220. The WCS 220 may store the energy it receives in an energy storage component 350. In some embodiments, the WCS 220 may not include a battery, instead the WCS 220 may temporarily store the energy it receives by inductance from the conductor into the energy storage component 350. The electrical power stored in the energy storage component 350 may be utilize for processor(s) 320 to function and to send a wireless signal to transformer controller 215 via wireless communication circuitry 370 and transmitter 380. Further, WCS 220 may include a memory 330, which contains instructions for the execution of the measurements and calculation that are to be done by the processor(s) 320. The processor(s) 320 may control the execution of the instructions that are stored in the memory 330, and the measurements and calculations that are performed may be sent to the transformer controller 215 via the wireless communication circuitry 370 and transmitter 380.

The current measurement circuitry 310 may receive the alternating current signal conducting via the windings surrounding the core of the WCS 220. As such, the current measurement circuitry 310 may measure a magnitude of the current waveform in the windings. The current waveform may represent the current conducting in the conductor surrounded by the core of the WCS 220. The current measurement circuitry 310 may send the measured current waveform to the processor(s) 320, such that the processor(s) 320 may determine the current conducting within the conductor by scaling the received current waveform by a ratio that corresponds to a number of windings in the winding surrounding the core.

Keeping the foregoing in mind, the processor(s) 320 may operate as thermal monitor by correlating current measurements with temperature measurements in the transformer 150. As such, the resulting temperature measurements may be analyzed to provide information regarding the operating conditions of the transformer 150. Also, the processor(s) 320 can also be used in the process of sensing faults in the transformer 150 and/or in the process of sensing the breakdown of components within the transformer 150, such as an insulation breakdown, based on the received current measurements from the CTs and the calculated internal temperatures of the transformer 150. As such, it may be beneficial to continuously monitor the internal properties of the transformer 150, since a surge of electrical power for a relatively small amount of time (e.g. a few milliseconds), can cause permanent damage to the transformer 150. Thus, monitoring temperature in the transformer 150 may assist in protecting the transformer 150 from incurring damage that may lead to shorter life expectancy for the transformer 150. That is, one or more component statuses (e.g. winding temperature, oil temperature, etc.) that indicate that the components are operating above some threshold (e.g. above the designed operating temperature for the respective component) may be a precursor to those components incurring permanent damage, which can decrease the life expectancy of the transformer 150.

In some cases, ambient air, oil, and winding temperatures in a transformer may be directly measured via sensors to inform protection systems about the thermal status of a transformer. However, when these sensors are not installed in transformers or become inoperable, the processor(s) 320 may analyze current data, as received from a CT, with respect to a thermal model for the transformer 150 to provide some indication with regard to an amount of load that is coupled to the transformer 150. In addition, a current rise, as detected by the CTs, may correspond to rising ambient, oil, and winding temperatures inside the transformer 150. However, these measurements may not accurately represent the temperatures inside the transformer 150. As such, by using current measurements for different phases of the transformer 150, the processor(s) 320 may determine a thermal status or temperature of component or part within the transformer 150.

With the foregoing in mind, the WCS 220 may provide current measurements to transformer controller 215, which may perform operations as described above with respect to the processor(s) 320. As mention earlier, in an existing substation, a CT may not be present on existing transformers already installed in a substation. As such, by employing the WCS 220, the present embodiments may enable a low-powered device that provides current data for the transformer controller 215 without powering down the transformer 150 to install a CT therein. That is, the WCS 220 may provide current data (e.g. magnitude, phase, and angle) to the transformer controller 215. The WCS 220 may include wireless communication circuitry that sends real time data to the transformer controller 215, which may apply the current measurements to a thermal model that outputs the temperature data for various positions inside the transformer 150.

Figure 4:
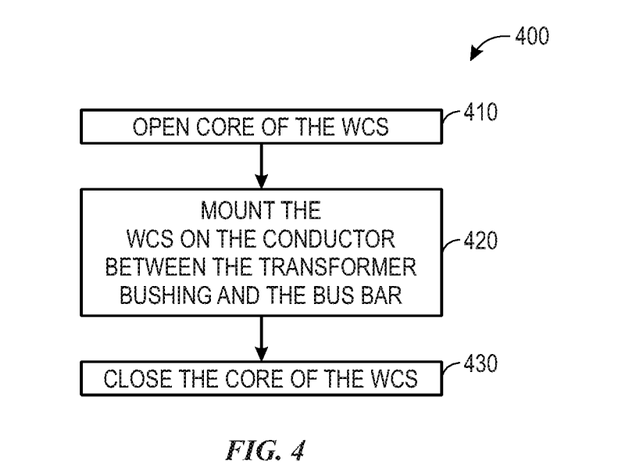
FIG. 4 is an example flow chart of a process for installing a wireless current sensor (WCS), in accordance with an embodiment.

FIG. 4 is an example flow chart of a process 400 for installing the WCS 220. Since the WCS 220 is installed while the transformer 150 is still operating, it is preferred for installers to use a hot stick to install the WCS 220. Further, since the WCS 220 should surround the conductor being monitored, the WCS 220 may include a split core current sensor or another current sensor that can be opened to surround the conductor connected to the output of the transformer 150. The split-core design may be a formed into a hexagonal, rectangular, or another shape, which would allow the core to be opened to encircle the conductor without disrupting the current conducting on the conductor. To install the WCS 220, the core of the WCS may be opened at block 410. Then, at block 420, the WCS 220 may be mounted on a conductor between the transformer bushing and a destination position (e.g., bus bar). Further, at block 430, the core of the WCS 220 may be closed. The process 400 in FIG. 4 may be accomplished using one or more hot sticks that may have clamping or wire tying features.

Figure 5:
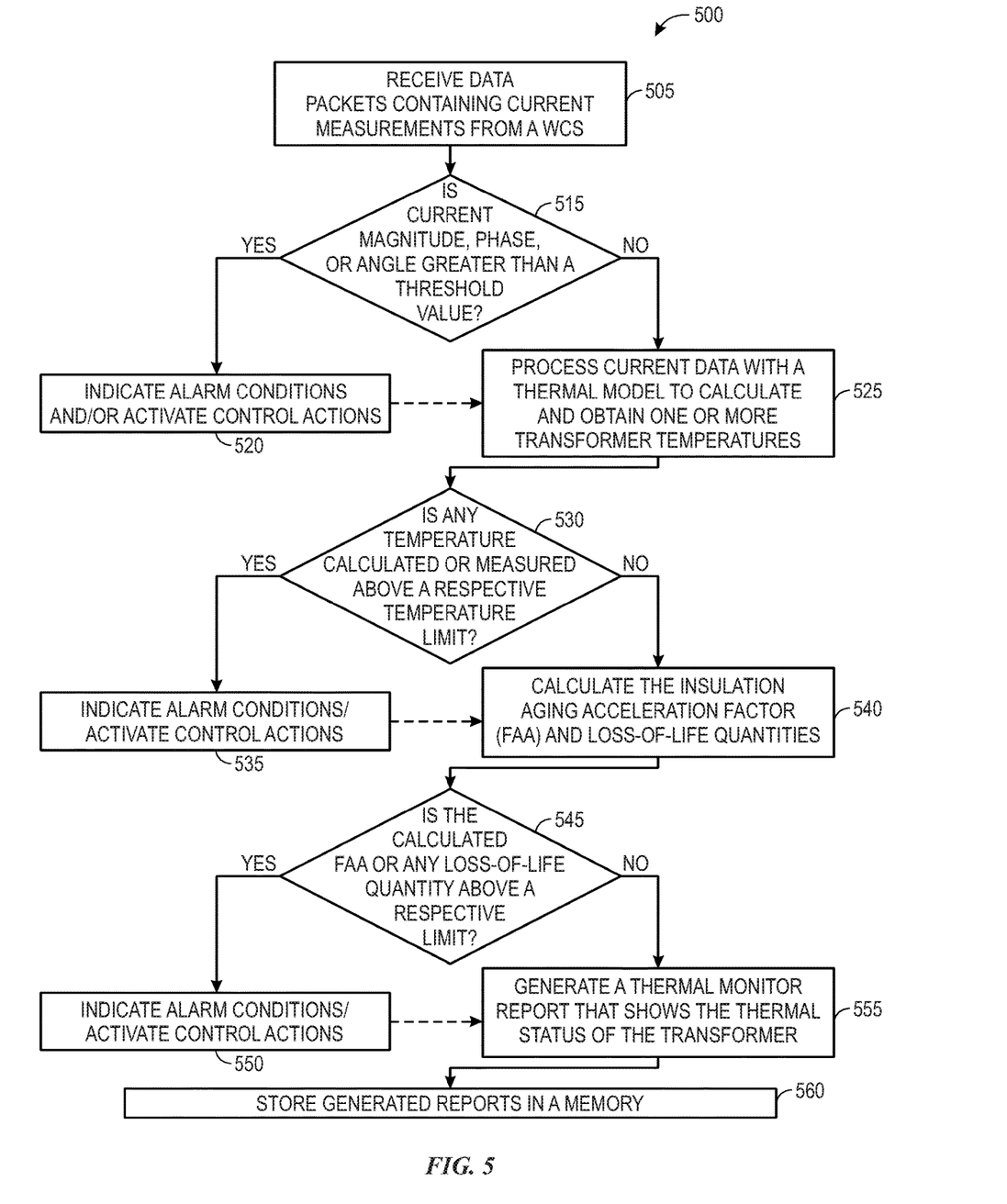
FIG. 5 is an example flow chart of a process for determining temperature properties of a transformer based on current measurements acquired from a wireless current sensor (WCS), in accordance with an embodiment.

FIG. 5 is a flow chart of a process 500 for monitoring thermal properties of the transformer 150 in accordance with the embodiments described herein. In some embodiments, the transformer controller 215 may perform the process 500 but any suitable controller may perform the process 500. In addition, although the process 500 is described in a particular order, it should be noted that the process 500 may be performed in any suitable order.

Referring now to FIG. 5, at block 505, a transformer controller 215 may wirelessly receive data packets containing current measurements (e.g. magnitude, phase, and angle) from the WCS 220. In some embodiments, the data packets received may also contain one or more identifiers that identifies a specific WCS 220 from which the data packet is transmitted. The current measurements in the data packets received may correspond to current data measured at real time or near real time (e.g., within milliseconds).

At block 515, the transformer controller 215 may compare the magnitude of the current data received from the WCS 220 with a rated current for the respective conductor or for the output of the transformer 150. In some embodiments, the transformer controller 215 may compare the phase and angle data of the current data with expected values (e.g. expected phase and angle) for the outputs of the transformer 150. If the measurement of the current magnitude, phase, or angle is greater than a respective threshold value for the current magnitude, phase, or angle, then, at block 520, the transformer controller 215 may produce an indication of alarm conditions or may activate control actions. That is, the transformer controller 215 may send a notification to a monitoring system or other suitable system that causes the receiving system to generate a visualization indicative of the alarm. In some embodiments, based on the type of alarm or condition detected at block 515, the transformer controller 215 may send a signal to a control component 222, such as a circuit breaker, to adjust its respective operations (e.g., open).

If the current magnitude is at, below, or less than the respective threshold, the transformer controller 215 may proceed to block 525 and apply the current data to a thermal model. The thermal model may include algorithms or functions that represent a relationship between temperatures of certain components within the transformer 150 and the detected current properties. For example, the temperature of oil in a certain part of the transformer 150 may directly relate to the current data detected by the WCS 220. In some embodiments, the thermal model may be determined using machine learning by observing the temperature changes, as determined using temperature sensors disposed in the transformer 150, with respect to detected current changes, as detected downstream or upstream the transformer 150.

The thermal model may also be representative of a relationship between transformer loading and a temperature rise in one or more windings in the transformer 150. The load on the transformer 150 may also be related to a temperature of ambient, oil, and winding temperatures in the transformer 150. As can be appreciated, the transformer 150 may be designed to operate within certain load limits to keep the temperature of the transformer 150 within certain operating limits to protect the life of the transformer 150. However, at times, the direct measurements (e.g., obtained via sensors) may not be received or may not be related to positions inside the transformer 150 that may be exposed to the highest temperature values. As such, the thermal model may provide more temperature measurements for locations in the transformer 150 that are inaccessible or do not include sensors positioned in a particular location. Indeed, in some embodiments, the thermal model may provide a heat map of how the temperature at various places inside the transformer 150 changes as current from the WCS 220 is received.

Further, for those transformers 150 that are not manufactured to include sensors that directly measure ambient air temperature and oil temperature, the transformer controller 215 may calculate expected temperatures based on the detected current via the WCS 220. That is, since power losses incurred in the transformer 150 may be attributed to eddy currents, resistance in the winding, reversing the magnetization of the transformer's core due to the alternating magnetic field induced by the alternating current, and other current related properties, monitoring the current in the transformer 150 with respect to the thermal model may allow the transformer controller 215 to detect whether damage may occur based on the modeled temperatures. For example, the transformer controller 215 may calculate an oil temperature and a hot-spot temperature (e.g. peak temperature in the winding) based on the thermal model. In addition, the transformer controller 215 may determine the temperature measurements when just a portion of measurements concerning ambient air temperature, oil temperature, winding temperature, and other sensed parameters are available.

Referring back to block 520, in some embodiments, the transformer controller 215 may continue to block 525 to apply the current data received from the WCS 220 with the thermal model to calculate and obtain one or more transformer temperatures after producing an indication of alarm conditions or activating control actions. In this way, the transformer controller 215 may monitor the internal properties of the transformer 150 as described below even under alarm conditions.

At block 530, the transformer controller 215 may determine whether the temperatures calculated at block 525 are above a temperature threshold. If so, then, at block 535, the transformer controller 215 may send an alarm or activate control actions to protect the transformer 150, as described above with respect to block 520. If the calculated temperatures are less than or equal to the temperature threshold, then the transformer controller 215 may proceed to block 540 and calculate an aging acceleration factor and/or loss-of-life quantities (e.g. life expectancy of the transformer, daily loss of life, etc.). That is, the transformer controller 215 may use the temperature values determined at block 525 to simulate a wear on the insulation materials within the transformer 150. Based on the simulation, the transformer controller 215 may determine a loss of life duration, time, or value for the transformer 150.

At block 545, if the loss of life duration, time, or value for the transformer 150 is above a threshold limit, then the transformer controller 215 may proceed to block 550 and signal an alarm or activate control actions to protect the transformer, as described above in block 520. In addition, if the loss of life duration, time, or value for the transformer 150 is less than or equal to a threshold limit, the transformer controller 215 may proceed to block 555 and generate a thermal report detailing the temperatures of various parts inside of the transformer 150. The thermal monitor report may include current data, calculated and measured temperatures, and other quantities calculated or used in calculations described above with respect to the process 500. Further, the report may include indications of any alarming conditions of the transformers. These reports may be generated hourly or daily or at another frequency as desired. The reports generated may be stored in a memory at block 560.

Furthermore, some depictions of logic circuitry have been described via this disclosure. It should be understood that logically-equivalent circuitry may be used herein to implement the systems and methods described. For example, a logical XOR gate may be replaced via a logically-equivalent combination of NOT gates, AND gates, Inverse NOT gates, OR gates, NAND gates, NOR gates, or the like.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system, comprising:
a transformer of an electric power delivery system configured to convert a first voltage to a second voltage, wherein the second voltage is output via a conductor; and
a wireless current sensor configured to detect current data associated with current conducting via the conductor and wirelessly transmit the current data to a transformer controller;
wherein the transformer controller comprises a processor configured to:
receive the current data from the wireless current sensor;
determine one or more temperature measurements associated with the transformer based on the current data; and
send a signal to a control component of the electric power delivery system configured to adjust one or more operations of the transformer in response to the one or more temperature measurements exceeding one or more respective threshold values.

2. The system of claim 1, wherein the processor is configured to determine the one or more temperature measurements associated with the transformer based on the current data and a thermal model associated with the transformer, wherein the thermal model is deployed in the transformer controller and configured to output the one or more measurements using the current data as input.

3. The system of claim 1, wherein the wireless current sensor is configured to couple to the conductor while the transformer outputs the second voltage.

4. The system of claim 1, comprising a thermal model, wherein the thermal model is deployed in the transformer controller and configured to calculate one or more temperature of the transformer based on at least the current data from the wireless current sensor.

5. The system of claim 1, wherein the processor is configured to receive additional current data from an additional wireless current sensor.

6. The system of claim 5, wherein the current data comprises a magnitude and a phase, wherein the phase is determined with respect to the additional current data.

7. The system of claim 6, wherein the processor is configured to:
compare the magnitude of the current data with a rated current associated with the conductor; and
send an additional signal comprising one or more alarm conditions to the control component in response to determining that the magnitude of the current data is above the rated current.

8. The system of claim 1, wherein the processor is configured to send an additional signal comprising one or more control actions to protect the transformer to the control component in response to determining that the current data is above a threshold value.

9. The system of claim 1, wherein the processor is configured to determine an aging acceleration factor associated with wear on insulation in the transformer based on the one or more temperature measurements.

10. The system of claim 1, wherein the wireless current sensor comprises an energy harvesting component configured to provide power to the wireless current sensor via inductance.

11. A method for determining one or more temperatures of a transformer of an electric power delivery system, the method comprising:
receiving, via a processor of a transformer controller, a plurality of data packets wirelessly transmitted from a wireless current sensor (WCS), wherein the plurality of data packets comprises one or more current measurements associated with a conductor attached to the transformer;
applying, via the processor, the one or more current measurements to a thermal model representative of a relationship between one or more temperature measurements of the transformer and one or more currents being conducted by the conductor, wherein the thermal model is deployed in the transformer controller and configured to calculate the one or more temperature measurements of the transformer based on at least the one or more current measurements;
determining, via the processor, the one or more temperature measurements of the transformer based on the thermal model and the one or more current measurements; and
sending, via the processor, an alarm to a control component of the electric power delivery system configured to adjust one or more operations of the transformer in response to the one or more temperature measurements being above a threshold.

12. The method of claim 11, comprising calculating an aging acceleration factor for insulation in the transformer based on the one or more temperature measurements.

13. The method of claim 11, comprising generating a thermal monitor report indicative of the one or more temperature measurements of the transformer, the alarm, or both.

14. The method of claim 11, wherein the one or more current measurements comprise one or more magnitudes of the one or more currents conducting via the conductor.

15. The method of claim 11, comprising determining one or more phases between the one or more current measurements and an additional one or more current measurements received from an additional wireless current sensor coupled to an additional conductor coupled to the transformer.

16. The method of claim 11, comprising:
determining if the one or more current measurements are greater than a current threshold value; and
sending an additional alarm to the control component in response to determining that the one or more current measurements are greater than the current threshold value.

17. A non-transitory, tangible, and computer readable medium, having instructions stored thereon, wherein the instructions, when executed by a computer processor, cause the computer processor to:
receive a plurality of data packets from a wireless current sensor (WCS), wherein the plurality of data packets comprises one or more current measurements associated with a conductor attached to a transformer of an electric power delivery system;
apply the one or more current measurements to a thermal model representative of a relationship between one or more temperature measurements of the transformer and one or more currents being conducted by the conductor, wherein the thermal model is deployed in a transformer controller and configured to calculate the one or more temperature measurements of the transformer based on at least the one or more current measurements;

determine the one or more temperature measurements of the transformer based on the thermal model and the one or more current measurements; and send an alarm to a control component of the electric power delivery system configured to adjust one or more operations of the transformer in response to the one or more temperature measurements being above a threshold.

18. The non-transitory, tangible, and computer readable medium of claim 17, wherein the one or more temperature measurements comprise an oil temperature in the transformer, a winding temperature in the transformer, or both.

19. The non-transitory, tangible, and computer readable medium of claim 17, further having instructions that cause the computer processor to determine one or more phases between the one or more current measurements and an additional one or more current measurements received from an additional wireless current sensor coupled to an additional conductor, wherein the transformer is coupled to the additional conductor.

20. The non-transitory, tangible, and computer readable medium of claim 17, further having instructions that cause the computer processor to determine a loss of life factor associated with the transformer based on the one or more temperature measurements.

* * * * *